US011631452B2

(12) United States Patent
Chang

(10) Patent No.: US 11,631,452 B2
(45) Date of Patent: Apr. 18, 2023

(54) MEMORY APPARATUS AND INITIALIZATION METHOD WITH SHORT BURST TYPE REFRESH OPERATION

(71) Applicant: Winbond Electronics Corp., Taichung (TW)

(72) Inventor: Kuen-Huei Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 22 days.

(21) Appl. No.: 17/393,383

(22) Filed: Aug. 3, 2021

(65) Prior Publication Data

US 2022/0076728 A1    Mar. 10, 2022

(30) Foreign Application Priority Data

Sep. 4, 2020 (TW) ................. 109130351

(51) Int. Cl.
| | |
|---|---|
| G11C 11/4072 | (2006.01) |
| G11C 7/12 | (2006.01) |
| G11C 11/4074 | (2006.01) |
| G11C 11/406 | (2006.01) |
| G11C 7/20 | (2006.01) |
| G11C 11/4094 | (2006.01) |

(52) U.S. Cl.
CPC ........... *G11C 11/4072* (2013.01); *G11C 7/12* (2013.01); *G11C 7/20* (2013.01); *G11C 11/406* (2013.01); *G11C 11/4074* (2013.01); *G11C 11/4094* (2013.01)

(58) Field of Classification Search
CPC ............ G11C 11/4072; G11C 11/4074; G11C 11/406; G11C 11/4094; G11C 7/12; G11C 7/20

See application file for complete search history.

(56) References Cited

U.S. PATENT DOCUMENTS

| | | | |
|---|---|---|---|
| 6,282,135 B1 * | 8/2001 | Proebsting | G11C 7/22 257/E21.659 |
| 8,605,489 B2 | 12/2013 | Reohr et al. | |
| 2004/0037141 A1 | 2/2004 | Raad | |
| 2005/0169083 A1 | 8/2005 | Riho et al. | |
| 2009/0103384 A1 | 4/2009 | Oh | |

OTHER PUBLICATIONS

WO-2008008227-A1 (Jan. 2008) (Blancha B).*
"Office Action of Taiwan Counterpart Application", dated Mar. 31, 2021, p. 1-p. 4.

* cited by examiner

*Primary Examiner* — Sultana Begum
(74) *Attorney, Agent, or Firm* — JCIPRNET

(57) ABSTRACT

A memory apparatus and an initialization method thereof are provided. The initialization method includes the following steps. A power-up operation is performed on the memory apparatus to provide an internal voltage to a memory array. After the internal voltage is stabilize, a refresh operation is performed on all storage cells.

8 Claims, 3 Drawing Sheets

MEMORY APPARATUS AND INITIALIZATION METHOD WITH SHORT BURST TYPE REFRESH OPERATION

CROSS-REFERENCE TO RELATED APPLICATION

This application claims the priority benefit of Taiwan application serial no. 109130351, filed on Sep. 4, 2020. The entirety of the above-mentioned patent application is hereby incorporated by reference herein and made a part of this specification.

BACKGROUND

Technical Field

The disclosure relates to a memory operation method, and in particular, to a memory apparatus and an initialization method thereof.

Description of Related Art

With rapid development of technology, semiconductor memory is widely used in electronic apparatuses nowadays. For applications that require high speeds and large data storage amounts, dynamic random access memory (DRAM) is the most commonly used solution.

A plurality of storage cells are provided in DRAM. FIG. 1 is a schematic diagram of circuits of a conventional storage cell. As shown in FIG. 1, a storage cell 100 includes a N-type storage transistor ST. A drain of the storage transistor ST is coupled to a bit line BL. A gate of the storage transistor ST is coupled to a word line WL. A source of the storage transistor ST is coupled to one end of a storage capacitor Ccell. The other end of the one end of the storage capacitor Ccell is coupled to a plate PLT. A node between the storage transistor ST and the storage capacitor Ccell is called as a storage node SN.

When DRAM is initialized, at the beginning, electric potentials of the word line WL, the bit line BL, and the plate PLT are all 0 volts, the storage transistor ST is not turned on, and the storage node ST is floating. After the power-up operation is performed, the electric potentials of the bit line BL and the plate PLT are pulled up to half of an operating voltage VDD. Since the storage transistor ST is not turned on, the storage node SN receives the coupling force from the plate PLT and is in a state slightly lower than half of the operating voltage VDD. In this way, when the storage transistor ST is turned on for the first time through the word line WL, noise from the plate PLT becomes significant, and the electric potential of the storage node SN shifts. As such, the reading and writing speed reduces, and a data reading and writing error may occur.

SUMMARY

The disclosure provides a memory apparatus and an initialization method thereof capable of automatically performing a refresh operation on all storage cells first after a power-up operation is completed.

An initialization method of a memory apparatus provided by the disclosure includes the following steps. A power-up operation is performed on the memory apparatus to provide an internal voltage to a memory array. After the internal voltage is stabilize, a refresh operation is performed on all storage cells.

In an embodiment of the disclosure, the step of performing the refresh operation on all of the storage cells includes the following steps. Each bit line corresponding to each of the storage cells is configured to an initial voltage. After corresponding access transistors are turned on for a setup time through a word line corresponding to a row address, the turned-on access transistors are turned off. The row address is progressively increased. Whether the row address exceeds a threshold value is determined. When the row address exceeds the threshold value, the refresh operation of a short burst type is ended.

A memory apparatus provided by the disclosure includes a memory array having a plurality of storage cells and a memory controller. The memory controller is coupled to the memory array. When a power-up operation is performed, the memory controller provides an internal voltage to the memory array. After the internal voltage is stabilize, the memory controller performs a refresh operation on all of the storage cells.

In an embodiment of the disclosure, each of the storage cells includes an access transistor. The memory controller configures each bit line corresponding to each of the storage cells to an initial voltage when a refresh operation of a short burst type is performed and turns off the turned-on access transistors after the corresponding access transistors are turned on for a setup time through a word line corresponding to a row address. The memory controller progressively increases the row address and determines whether the row address exceeds a threshold value. The memory controller ends the refresh operation of the short burst type when the row address exceeds the threshold value.

To sum up, after the power-up operation is performed, the memory apparatus provided by the disclosure may perform the refresh operation on all of the storage cells first to actively fix the storage nodes to the correct electric potential. Accordingly, even when the memory apparatus is used for the first time after the power-on operation, the electric potentials of the storage nodes do not shift. In this way, the reading and writing speed is prevented from reducing, and a data reading and writing error is prevented from occurring.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
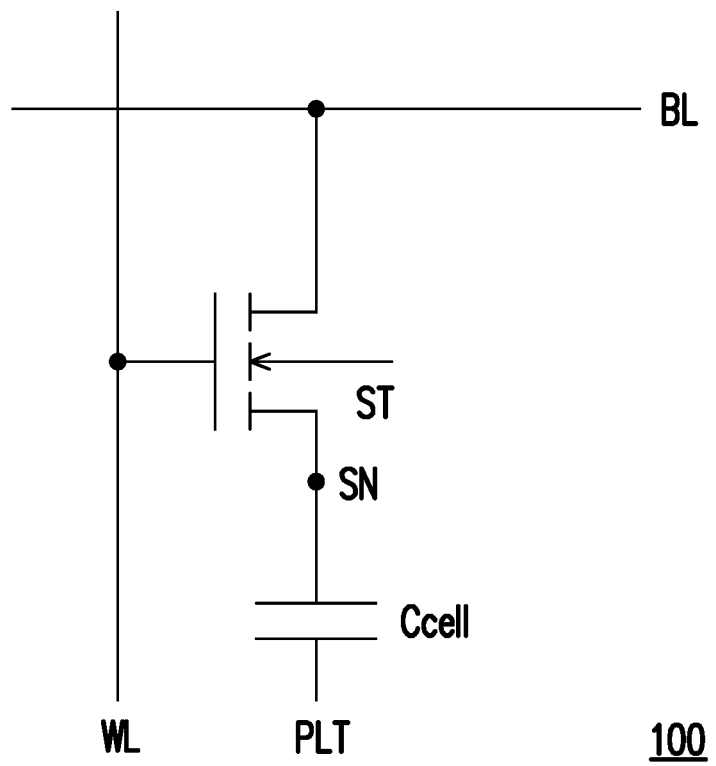
FIG. 1 is a schematic diagram of circuits of a conventional storage cell.
Figure 2:
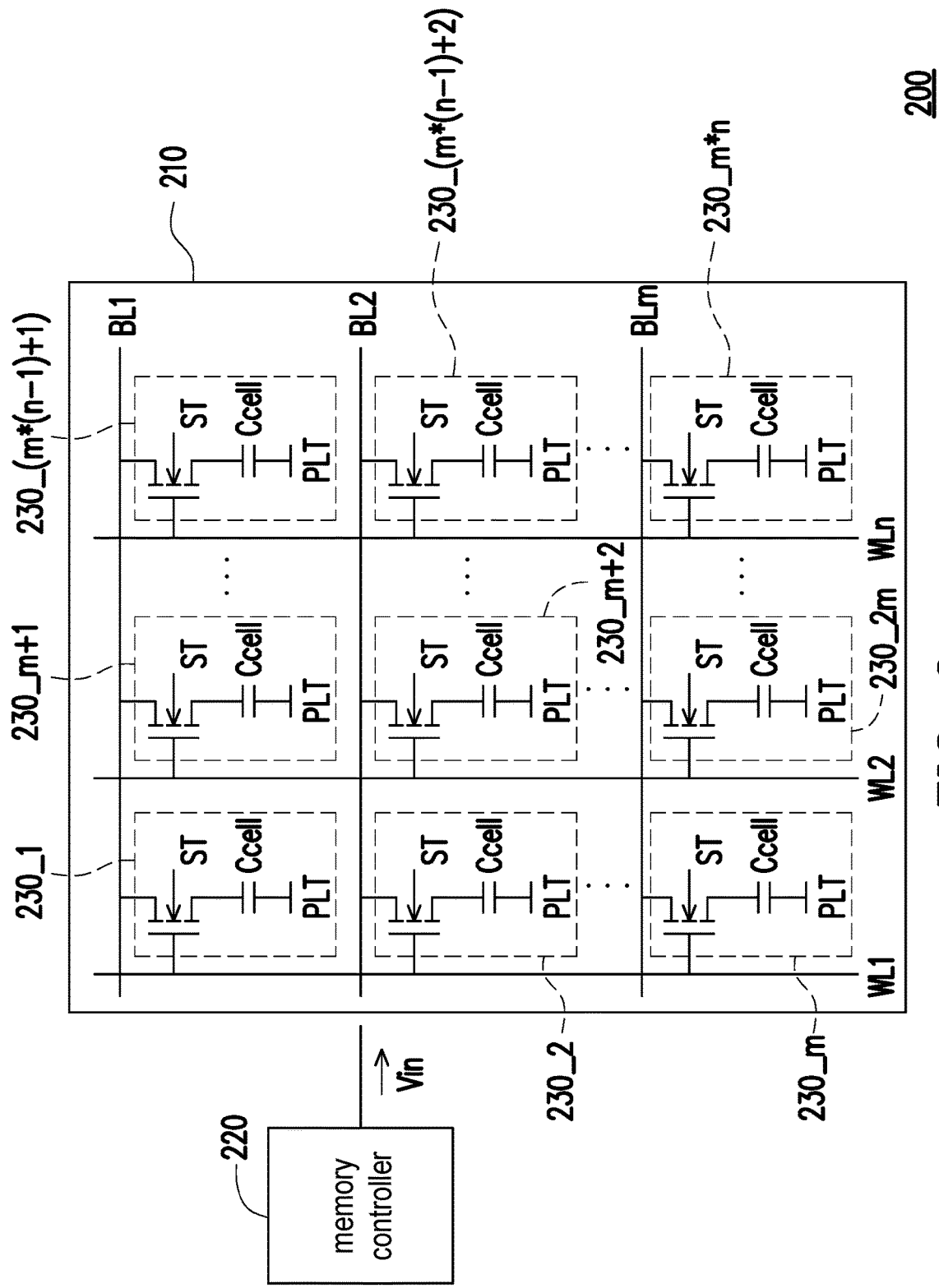
FIG. 2 is a schematic diagram of circuits of a memory apparatus according to an embodiment of the disclosure.

With reference to FIG. 2, FIG. 2 is a schematic diagram of circuits of a memory apparatus according to an embodiment of the disclosure. A memory apparatus 200 includes a memory array 210 and a memory controller 220. The memory array 210 is a memory array of, for example, a dynamic random access memory. As shown in FIG. 1, the memory array 210 includes storage cells 230_1 to 230_$m$*n. Each of the storage cells 230_1 to 230_$m$*n includes a N-type storage transistor ST and a storage capacitor Ccell. The storage transistors ST of the storage cells 230_1 to 230_$m$*n are coupled to bit lines BL1 to BLm and word lines WL1 to WLn. As shown in FIG. 1, gates of the storage transistors ST of the storage cells 230_1 to 230_$m$ are coupled to the word line WL1, and drains of the storage transistors ST of the storage cells 230_1 to 230_$m$ are respectively coupled to the bit lines BL1 to BLm. Further, gates of the storage transistors ST of the storage cells 230_$m$+1 to 230_$2m$ are coupled to the word line WL2, and drains of the storage transistors ST of the storage cells 230_$m$+1 to 230_$2m$ are respectively coupled to the bit lines BL1 to BLm. The rest may be deduced by analogy, and m and n are positive integers greater than 2. In an embodiment, m is, for example, 16K, n is, for example, 2K, and the numbers thereof are not intended to limit the disclosure.

Taking the storage cell 230_1 as an example, in the storage cell 230_1, the drain of the storage transistor ST is coupled to the bit line BL1. The gate of the storage transistor ST is coupled to the word line WL1. A source of the storage transistor ST is coupled to one end of the storage capacitor Ccell. The other end of the one end of the storage capacitor Ccell is coupled to a plate PLT.

The memory controller 220 is coupled to the memory array 210. The memory controller 220 is configured to perform a write operation, a read operation, a refresh operation, a verification operation, and other similar operations on the memory array 210. The memory controller 220 may be a processor featuring a computing capability. Alternatively, the memory controller 220 may be designed through hardware description language (HDL) or any other digital circuit design well known to a person of ordinary skill in the art and may be a hardware circuit implemented through a field programmable gate array (FPGA), a complex programmable logic device (CPLD), or an application-specific integrated circuit (ASIC).

Figure 3:
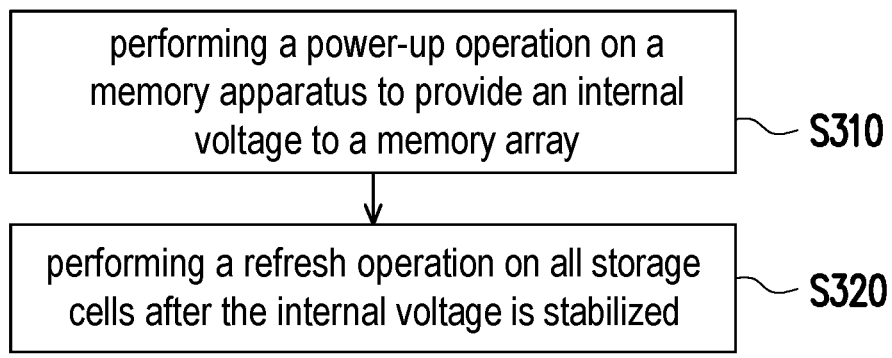
FIG. 3 is a flow chart of an initialization method of a memory apparatus according to an embodiment of the disclosure.

FIG. 3 is a flow chart of an initialization method of a memory apparatus according to an embodiment of the disclosure. With reference to FIG. 2 and FIG. 3 together, the method provided by this embodiment is adapted for the memory apparatus 200, and steps of the method provided by this embodiment are explained in detail below with reference to the components in the memory apparatus 200 in FIG. 2.

In step S310, a power-up operation is performed on the memory apparatus 200 to provide an internal voltage Vin to the memory array 210 through the memory controller 220. The internal voltage Vin (includes a plurality of voltages actually) provided by the memory controller 220 may enable the storage cells 230_1 to 230_$m$*n in the memory array 210 to start functioning to execute various operations.

Next, in step S320, after the internal voltage Vin is stabilized, the memory controller 220 performs a refresh operation on all of the storage cells 230_1 to 230_$m$*n.

Figure 4:
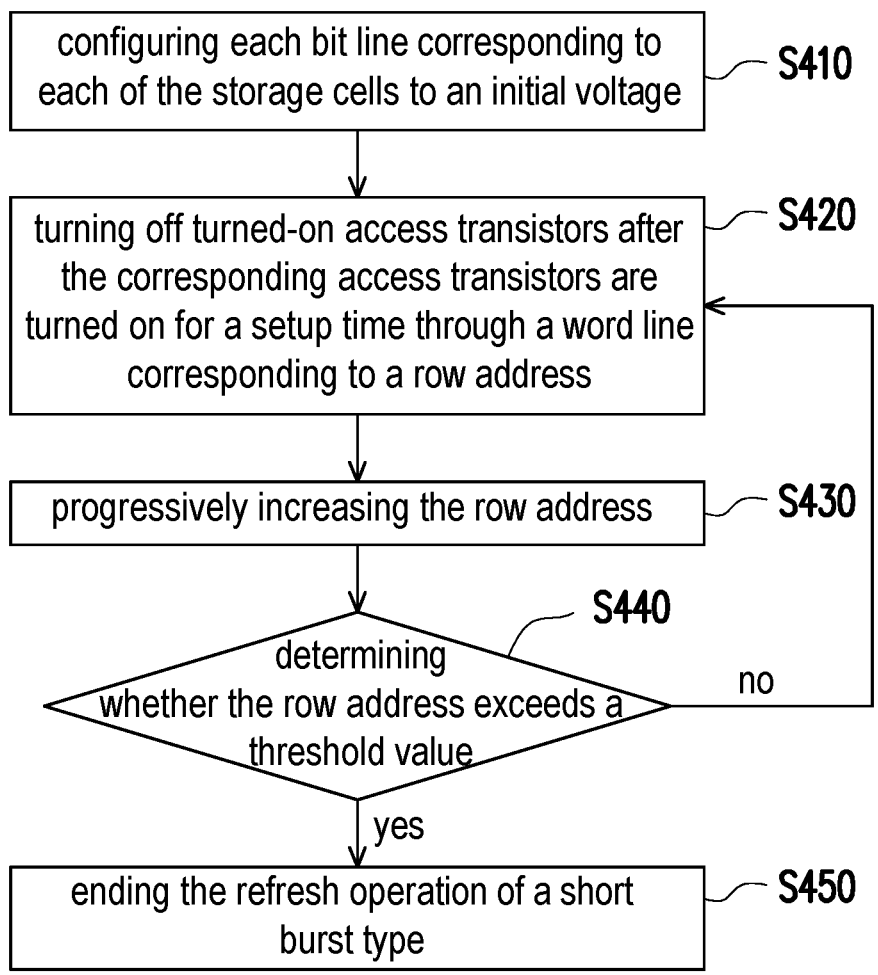
FIG. 4 is a flow chart of a refresh operation of a short burst type according to an embodiment of the disclosure.

For instance, the memory controller 220 performs, for example, a refresh operation of a short burst type on all of the storage cells 230_1 to 230_$m$*n. FIG. 4 is a flow chart of a refresh operation of a short burst type according to an embodiment of the disclosure. With reference to FIG. 2 and FIG. 4 together, the method provided by this embodiment is adapted for the memory apparatus 200, and steps of the method provided by this embodiment are explained in detail below with reference to the components in the memory apparatus 200 in FIG. 2.

In step S410, the memory controller 220 configures the bit lines BL1 to BLm corresponding to the storage cells 230_1 to 230_$m$*n to an initial voltage. The initial voltage is 0 volts, for example.

Next, in step S420, after the access transistors ST in the storage cells 230_1 to 230_$m$ are turned for a setup time through the word line WL1 corresponding to a row address RADS, the memory controller 220 turns off the turned-on access transistors ST in the storage cells 230_1 to 230_$m$ through the word line WL1. To be specific, at first, the row address RADS corresponds to the word line WL1, and when the access transistors ST in the storage cells 230_1 to 230_$m$ are turned on, the memory controller 220 may refresh values stored in the storage cells 230_1 to 230_$m$ through an electric potential of the bit lines BL1 to BLm. The setup time is 10 nanoseconds, for example. In this way, storage nodes SN in the storage cells 230_1 to 230_$m$ are fixed to an appropriate potential without shifting.

Next, in step S430, the memory controller 220 may progressively increases the row address RADS (row address RADS+1). Further, in step S440, the memory controller 220 may determine whether the progressively increased row address RADS exceeds a threshold value. In this embodiment, the threshold value is, for example, a value of a row address corresponding to the last word line WLn in the memory array 210.

When the row address RADS does not exceed the threshold value, it indicates that there are still storage cells that are not refreshed yet. The memory controller 220 returns to step S420 and keeps repeating step S420 and step S430. At this time, the progressively increased row address RADS is changed to correspond the word line WL2, and the objects to be refreshed are changed to the storage cells 230_$m$+1 to 230_$2m$ controlled by the word line WL2, and the rest may be reduced by analogy until the row address RADS is progressively increased to exceed the threshold value.

When the row address RADS exceeds the threshold value, it indicates that all of the storage cells 230_1 to 230_$m$*n are refreshed. Finally, in step S450, the memory controller 220 ends the refresh operation of the short burst type.

Note that the refresh operation of the short burst type is performed by the memory controller 220 on all of the storage cells 230_1 to 230_$m$*n in this embodiment, which should however not be construed as limitations to the disclosure. In other embodiments, a similar refresh operation of a standard burst type adopted by a general refresh command may also be performed by the memory controller 220 on the storage cells 230_1 to 230_$m$*n.

In view of the foregoing, after an electronic apparatus installed with the dynamic random access memory is turned on for performing the power-up operation, the memory apparatus provided by the disclosure may perform the refresh operation on all of the storage cells first to actively fix the storage nodes in the storage cells to the correct electric potential. Accordingly, even when the memory apparatus is used for the first time after the power-on operation, the electric potentials of the storage nodes do not shift. In this way, the reading and writing speed is prevented from reducing, and a data reading and writing error is prevented from occurring.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An initialization method of a memory apparatus comprising a memory array having a plurality of storage cells, the initialization method comprising:
    performing a power-up operation on the memory apparatus to provide an internal voltage to the memory array; and
    performing a refresh operation of a short burst type on all of the storage cells after the internal voltage is stabilized,
    wherein each of the storage cells comprises an access transistor, and the step of performing the refresh operation of the short burst type on all of the storage cells comprises:
        configuring each bit line corresponding to each of the storage cells to an initial voltage;
        turning off the turned-on access transistors after the corresponding access transistors are turned on for a setup time through a word line corresponding to a row address;
        progressively increasing the row address;
        determining whether the row address exceeds a threshold value; and
        ending the refresh operation of the short burst type when the row address exceeds the threshold value.

2. The initialization method of the memory apparatus according to claim 1, wherein after the step of determining whether the row address exceeds the threshold value is performed, the initialization method of the memory apparatus further comprises:
    repeating the turning on step and the progressively increasing step until the row address exceeds the threshold value when the row address does not exceed the threshold value.

3. The initialization method of the memory apparatus according to claim 1, wherein the setup time is 10 nanoseconds.

4. The initialization method of the memory apparatus according to claim 1, wherein the initial voltage is 0 volts.

5. A memory apparatus, comprising:
    a memory array, having a plurality of storage cells; and
    a memory controller, coupled to the memory array providing an internal voltage to the memory array when a power-up operation is performed;
    wherein the memory controller performs a refresh operation of a short burst type on all of the storage cells after the internal voltage is stabilized,
    wherein each of the storage cells comprises an access transistor,
    the memory controller configures each bit line corresponding to each of the storage cells to an initial voltage when the refresh operation of the short burst type is performed and turns off the turned-on access transistors after the corresponding access transistors are turned on for a setup time through a word line corresponding to a row address,
    the memory controller progressively increases the row address and determines whether the row address exceeds a threshold value, and the memory controller ends the refresh operation of short burst type when the row address exceeds the threshold value.

6. The memory apparatus according to claim 5, wherein the memory controller repeats the turning on step and the progressively increasing step until the row address exceeds the threshold value when the row address does not exceed the threshold value.

7. The memory apparatus according to claim 5, wherein the setup time is 10 nanoseconds.

8. The memory apparatus according to claim 5, wherein the initial voltage is 0 volts.

* * * * *